United States Patent
Noh et al.

(10) Patent No.: US 9,728,710 B2
(45) Date of Patent: Aug. 8, 2017

(54) METHOD FOR MANUFACTURING ULTRASOUND PROBE USING DEPOLED PIEZOELECTRIC BODY

(75) Inventors: Wonho Noh, Seoul (KR); Susung Lee, Yongin-si (KR); Hoyoung Lee, Seoul (KR); Jaewon Lee, Incheon (KR); Boyeon Cho, Yongin-si (KR)

(73) Assignee: ALPINION MEDICAL SYSTEMS CO., LTD. (KR)

( * ) Notice: Subject to any disclaimer, the term of this patent is extended or adjusted under 35 U.S.C. 154(b) by 265 days.

(21) Appl. No.: 14/422,622

(22) PCT Filed: Aug. 23, 2012

(86) PCT No.: PCT/KR2012/006716
§ 371 (c)(1),
(2), (4) Date: Feb. 19, 2015

(87) PCT Pub. No.: WO2014/030784
PCT Pub. Date: Feb. 27, 2014

(65) Prior Publication Data
US 2015/0221859 A1    Aug. 6, 2015

(30) Foreign Application Priority Data

Aug. 22, 2012   (KR) .................. 10-2012-0091962

(51) Int. Cl.
*H01L 41/25* (2013.01)
*H01L 41/335* (2013.01)
*B06B 1/06* (2006.01)

(52) U.S. Cl.
CPC ............... *H01L 41/25* (2013.01); *B06B 1/06* (2013.01); *B06B 1/0622* (2013.01); *H01L 41/335* (2013.01); *Y10T 29/42* (2015.01)

(58) Field of Classification Search
CPC .. G01N 29/2437; G01N 29/245; H01L 41/25; H01L 41/335; B06B 1/06; B06B 1/0622; Y10T 29/42
(Continued)

(56) References Cited

U.S. PATENT DOCUMENTS 5,295,487 A * 3/1994 Saitoh ................. B06B 1/06
                                                     310/334
5,325,012 A * 6/1994 Sato ..................... H01L 41/313
                                                     228/121
(Continued)

FOREIGN PATENT DOCUMENTS

JP    06-343633 A    12/1994
JP    08-070497 A    3/1996
(Continued)

OTHER PUBLICATIONS

International Search Report (in Korean and English) for PCT/KR2012/006716, mailed Mar. 28, 2013; ISA/KR.

*Primary Examiner* — Laura Martin
*Assistant Examiner* — Rose M Miller
(74) *Attorney, Agent, or Firm* — Harness, Dickey & Pierce, P.L.C.

(57) ABSTRACT

The present disclosure of at least one embodiment provides a method for manufacturing ultrasound probes comprising a machining process, the method including depoling a piezoelectric element as a material for the ultrasonic probes before the machining process.

10 Claims, 8 Drawing Sheets

(58) Field of Classification Search
USPC .......................... 73/632; 29/25.35; 310/357
See application file for complete search history.

(56) References Cited

U.S. PATENT DOCUMENTS

| | | | |
|---|---|---|---|
| 5,542,426 A | | 8/1996 | Watanabe et al. |
| 5,706,820 A | * | 1/1998 | Hossack .............. B06B 1/0648 |
| | | | 29/25.35 |
| 5,884,627 A | * | 3/1999 | Wakabayashi .......... A61B 8/12 |
| | | | 600/447 |
| 8,035,278 B2 | | 10/2011 | Shikata et al. |
| 8,777,861 B2 | | 7/2014 | Roh et al. |
| 2006/0079785 A1 | * | 4/2006 | Hosono ................ A61B 8/4281 |
| | | | 600/459 |
| 2009/0134746 A1 | | 5/2009 | Shikata et al. |
| 2014/0316276 A1 | | 10/2014 | Bae et al. |
| 2014/0321244 A1 | | 10/2014 | Lee |
| 2015/0372219 A1 | * | 12/2015 | Yamashita ............. H01L 41/41 |
| | | | 310/334 |

FOREIGN PATENT DOCUMENTS

| | | |
|---|---|---|
| JP | 2001-102651 A | 4/2001 |
| JP | 2002-299712 A | 10/2002 |
| KR | 10-2009-0053712 A | 5/2009 |

\* cited by examiner

US 9,728,710 B2

METHOD FOR MANUFACTURING ULTRASOUND PROBE USING DEPOLED PIEZOELECTRIC BODY

TECHNICAL FIELD

The present disclosure in one or more embodiments relates to a method for manufacturing a probe using a piezoelectric material as elements for transducers. More particularly, the present disclosure relates to a method for manufacturing an ultrasound probe by using a piezoelectric material with improved mechanical workability.

BACKGROUND

The statements in this section merely provide background information related to the present disclosure and do not constitute prior art.

An ultrasound probe is adapted to transmit an ultrasonic signal for ultrasonic imaging to an object and receive an ultrasonic echo signal reflected from the object.

Sonic probes may be applied to a variety of industrial fields. In particular, sonic probes are useful for medical apparatus such as an ultrasonic diagnostic apparatus which emits an ultrasonic signal from the outside surface of an object toward a desired internal site of the object and then noninvasively acquire tomograms of soft tissues or bloodstream by using a reflected ultrasonic echo signal.

The principle for an ultrasound probe to transmit and receive ultrasound waves is to utilize the characteristics of piezoelectric materials. A piezoelectric material refers to what interconverts between electrical energy and mechanical energy. For example, the piezoelectric material used for ultrasound probes vibrates and at the same time, emits ultrasound waves, when a voltage is applied across electrodes formed in its upper and lower parts, receives ultrasound waves reflected by a scattering/reflecting object within another object or body and converts the received ultrasound wave into an electrical signal.

An ultrasound probe generally uses a piezo-ceramic, piezo-composite, piezo-single crystal or the like as a piezoelectric material.

PZT is a solid solution material of lead zirconate titanate, which is the most widely used thanks to its manufacturability and superior piezoelectric and dielectric properties.

When taking microscopic observation of PZT having a perovskite structure, grain boundaries are present having dipoles therein. Dipoles have polarity, but face randomly different directions. Accordingly, the overall polarity of dipoles is zero, which exhibits no piezoelectricity.

However, piezoelectricity may be generated by a poling process for applying a voltage to a piezoelectric material. When the electrical energy is applied to the piezoelectric material, polarization is established whereby dipoles are polarized and rotated, and are then aligned in one direction. As a result, the piezoelectric material becomes available for operation.

A typical process for manufacturing ultrasound probes uses a piezoelectric material in which dipoles are aligned in one direction. In other words, machining and laminating are performed on the polarized piezoelectric material. However, it is disadvantageous that polarized piezoelectric materials, in particular, single crystalline piezoelectric materials are easily damaged by size-cutting or dicing and have low mechanical workability such as non-uniform dicing.

DISCLOSURE

Technical Problem

Therefore, the present disclosure in some embodiments effectively resolves the above-described limitations and provides a method for manufacturing ultrasound probes using a depoled piezoelectric material.

SUMMARY

In accordance with some embodiments of the present disclosure, a method for manufacturing an ultrasound probe comprises a machining process and depoling a piezoelectric material used for the ultrasonic probes and then performing the machining process. The machining process may include a size-cutting. In addition, the machining process may include a dicing.

Another embodiment of the present disclosure provides a method for manufacturing an ultrasound probe using a piezoelectric material used for the ultrasonic probe, the method including introducing a depoled piezoelectric material into a manufacturing process for the ultrasonic probe.

In accordance with yet another embodiment of the present disclosure, a method for manufacturing an ultrasound probe is provided comprising depoling a piezoelectric plate, performing size-cutting of the depoled piezoelectric plate, and forming a first electrode and a second electrode on a first surface of the size-cut piezoelectric plate and on a second surface opposite to the first surface, respectively.

Yet another embodiment of the present disclosure provides an ultrasound probe manufactured by one of the methods described above.

Advantageous Effects

According to the present disclosure as described above, a method for manufacturing an ultrasound probe according to at least one embodiment of the present disclosure uses a depoled piezoelectric material, thus advantageously improving mechanical workability of the piezoelectric material, decreasing defective rate and reducing manufacturing costs.

DETAILED DESCRIPTION

Figure 1:
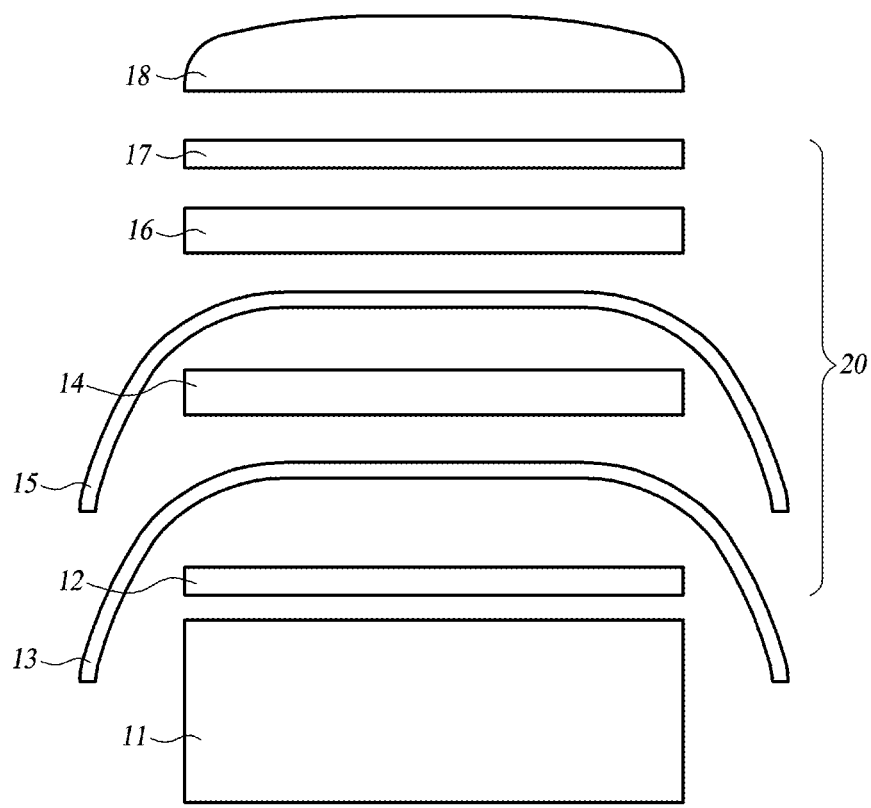
FIG. 1 is a schematic diagram illustrating a configuration of an ultrasound probe.

A method for manufacturing an ultrasound probe using a depoled piezoelectric material according to at least one embodiment of the present disclosure will be described in detail with reference to the annexed drawings. The present disclosure may be embodied with many modifications and in different forms and reference will now be made in detail to the preferred embodiments, examples of which are illustrated in the accompanying drawings. The disclosure should not be construed as limited to the embodiments set forth herein and includes modifications, equivalents and substitutions which fall into the idea and scope of the disclosure. In the drawings, like reference numerals refer to like elements throughout. The dimension of elements may be exaggerated for clarity or reduced for better understanding of schematic configurations.

It will be understood that, although terms including ordinal numbers such as first or second may be used herein to describe various elements, these elements should not be limited by these terms. These terms are only used to distinguish one element from another element. For example, a first element could be termed second element and a second element could be termed first element without departing from the teachings of the present disclosure. Unless otherwise defined, all terms (including technical and scientific terms) used herein have the same meaning as commonly understood by those having ordinary knowledge in the art to which the present disclosure pertains. It will be further understood that terms, such as those defined in commonly used dictionaries, should be interpreted as having a meaning that is consistent with their meaning in the context of the relevant art, and will not be interpreted in an idealized or overly formal sense unless expressly so defined herein.

FIG. 1 is a schematic diagram illustrating a configuration of an ultrasound probe according to at least one embodiment of the present disclosure. Referring to FIG. 1, the probe includes at least one of a backing layer (sound-absorbing layer) 11, a substrate 12 disposed on the backing layer 11, a printed circuit board 13 disposed on the substrate 12, a piezoelectric plate 14 disposed on the printed circuit board 13, a ground layer 15 disposed on the piezoelectric plate 14, a first acoustic matching layer 16 disposed on the ground layer 15, a second acoustic matching layer 17 disposed on the first acoustic matching layer 16 and an acoustic lens 18 disposed on the second acoustic matching layer 17.

A structure in which the piezoelectric plate 14 is laminated on the printed circuit board 13 is referred to as a first laminate. A laminated structure formed of the substrate 12, the printed circuit board 13, the piezoelectric plate 14, the ground layer 15, the first acoustic matching layer 16 and the second acoustic matching layer 17 is referred to as a second laminate 20.

The piezoelectric material refers to a material inducing a piezoelectric effect. The piezoelectric material includes a piezoelectric single crystal.

The printed circuit board 13 may be a flexible printed circuit board.

The backing layer 11 suppresses free vibration of the piezoelectric material to reduce the pulse width of ultrasound waves and prevents the ultrasound waves from travelling to the back of the piezoelectric material and prevents an image distortion.

The substrate 12 serves as a support for a plurality of final ultrasound transducers 21 and it is made of an electric insulator and generally uses the same material as that of the backing layer or a material having similar acoustic characteristics thereto.

The acoustic matching layers 16 and 17 serve to match an acoustic impedance of the piezoelectric material with an acoustic impedance of the object to probe for efficiently transferring an ultrasonic signal generated by the piezoelectric material to the object and they typically have a median value between the acoustic impedance of the piezoelectric material and the acoustic impedance of the object. The acoustic matching layers 16 and 17 may be made from a ceramic, a resin or a composite of a resin and a metal, ceramic powder or the like, and may include a first acoustic matching layer 16 and a second acoustic matching layer 17 which are made of different materials so that the acoustic impedance changes stepwise from the piezoelectric material toward the object.

The acoustic lens 18 is adapted to focus ultrasonic signals travelling forward upon a certain site.

Figure 2:
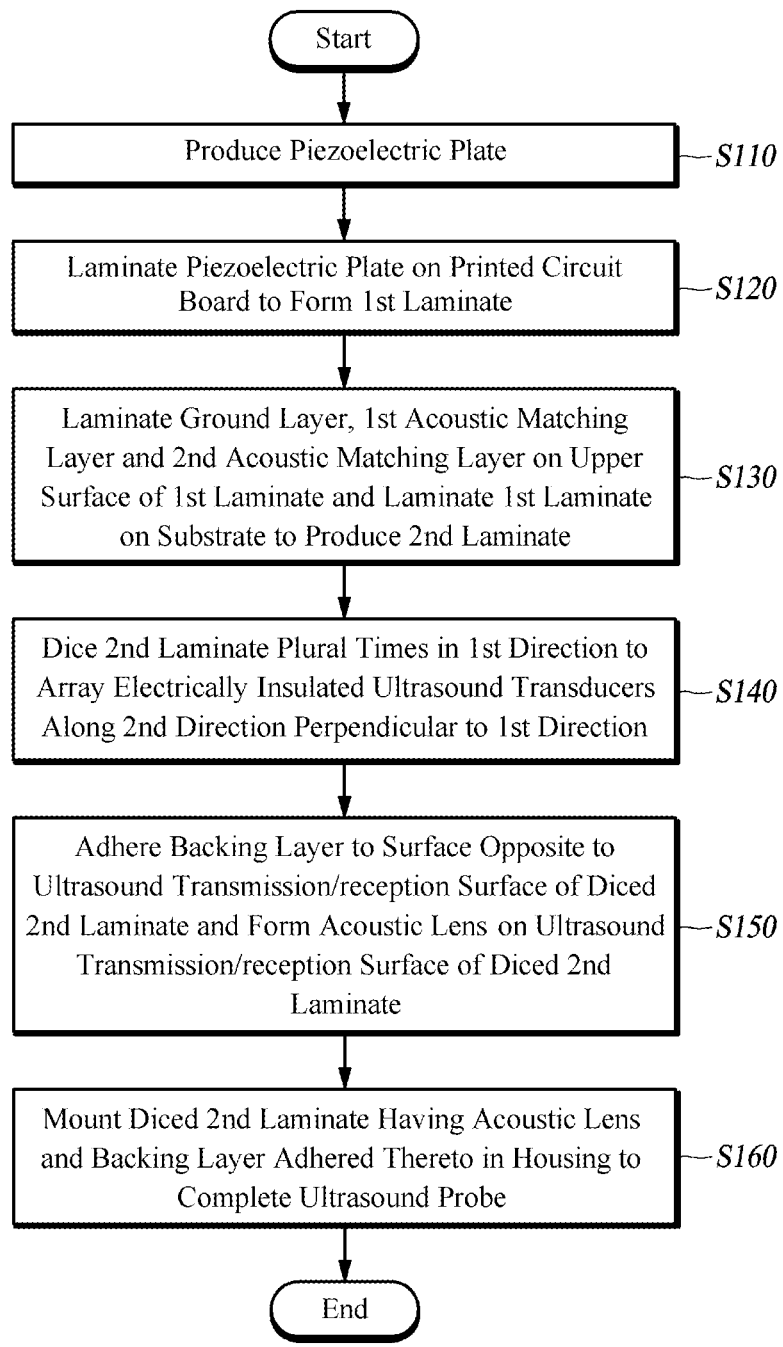
FIG. 2 is a flowchart schematically illustrating a method for manufacturing an ultrasound probe.
Figure 3:
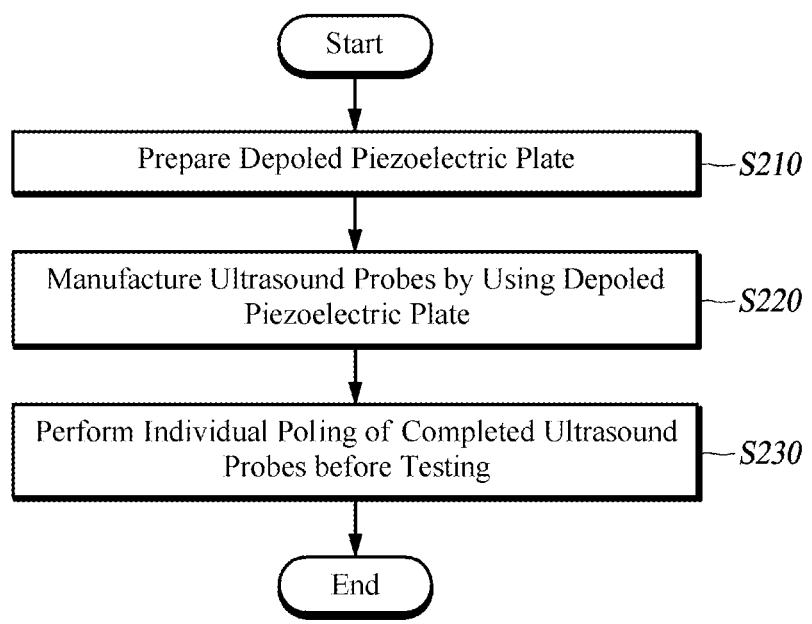
FIG. 3 is a flowchart schematically illustrating a method for manufacturing an ultrasound probe according to at least one embodiment of the present disclosure.
Figure 4A:
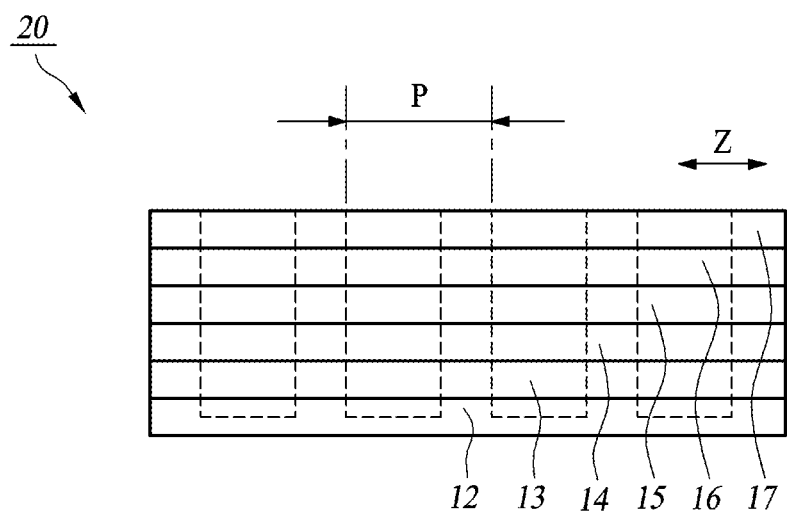
FIGS. 4A and 4B are diagrams illustrating a portion of a second laminate removed by dicing.
Figure 4B:
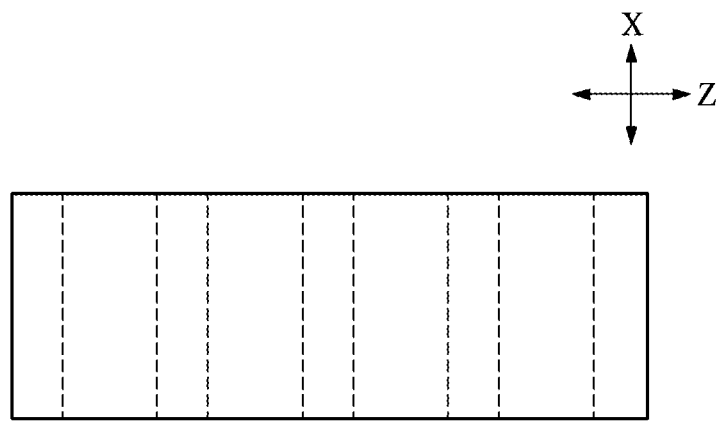
Figure 5A:
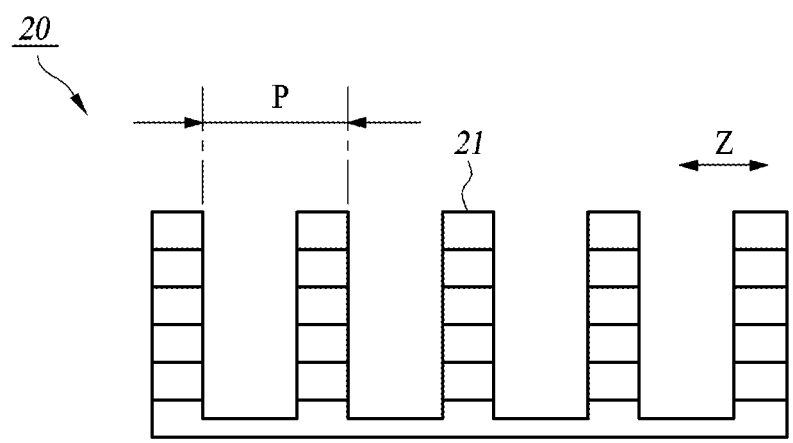
FIGS. 5A and 5B are diagrams illustrating an array of a plurality of ultrasound transducers.
Figure 5B:
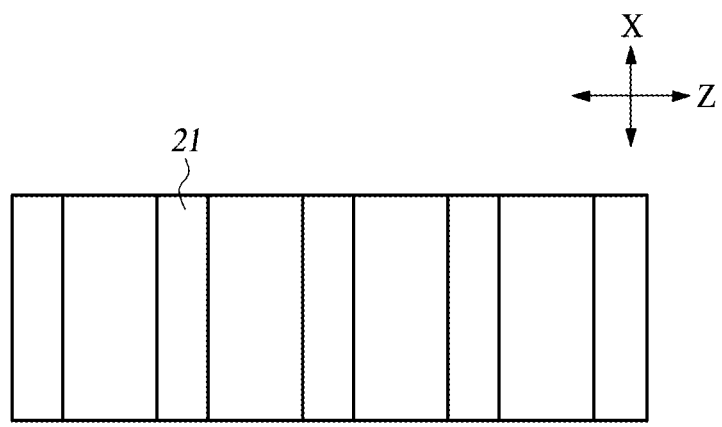
Figure 6:
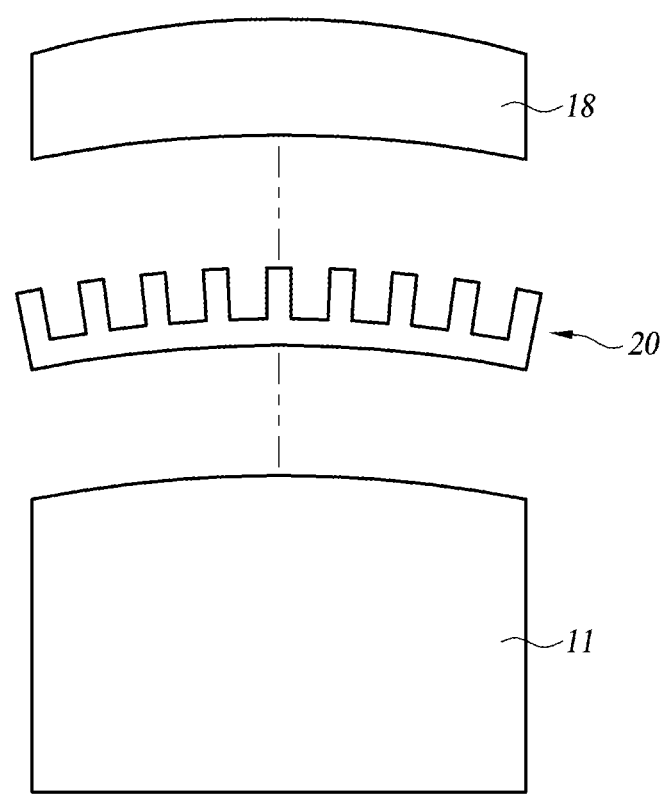
FIG. 6 is a diagram illustrating a backing layer adhered to a lower surface of the diced second laminate and an acoustic lens adhered to an upper surface thereof.

FIG. 2 is a flowchart schematically illustrating a method for manufacturing an ultrasound probe. FIG. 3 is a flowchart schematically illustrating a method for manufacturing an ultrasound probe according to at least one embodiment of the present disclosure. FIGS. 4A and 4B are a front view and a plan view illustrating a portion of a second laminate 20 removed by dicing, respectively. FIGS. 5A and 5B are a front view and a plan view illustrating an array of a plurality of ultrasound transducers 21 formed by dicing the second laminate 20. Wiring lines extending from the printed circuit board 13 are not shown for the sake of illustration of the present disclosure. FIG. 6 shows the backing layer 11 adhered to a lower surface of the diced second laminate 20 and an acoustic lens 18 adhered to an upper surface thereof.

The method for manufacturing an ultrasound probe may include producing the piezoelectric plate 14 (S110). In addition, the method may include laminating the piezoelectric plate 14 on the printed circuit board 13 to form the first laminate (S120). In addition, the method may include laminating the ground layer 15, the first acoustic matching layer 16 and the second acoustic matching layer 17 on an upper surface of the first laminate and laminating the first laminate on the substrate 12 to produce the second laminate 20 (S130). In addition, the method may include dicing the second laminate 20 in a first direction (X direction, see FIGS. 4A, 4B, 5A and 5B) and dicing the second laminate 20 a plurality of times in a second direction (Z direction) which is perpendicular to the first direction (X direction) by a predetermined distance P (see FIGS. 4A, 4B, 5A and 5B) to array a plurality of ultrasound transducers 21 (see FIG. 5) electrically insulated along the second direction (Z direction, see FIGS. 4A, 4B, 5A and 5B) (S140). In addition, the method may include adhering the backing layer 11 to a surface opposite to an ultrasound transmission/reception surface of the diced second laminate 20 (see FIG. 6) and forming the acoustic lens 18 on the ultrasound transmission/reception surface of the diced second laminate 20 (S150). In addition, the method may include seating the diced second laminate 20 having the acoustic lens 18 and the backing layer 11 adhered thereto in a housing to complete manufacturing of the ultrasound probe (S160).

The production of the piezoelectric plate 14 (S110) may include machining a wafer into the piezoelectric plate 14. A piezoelectric plate supplier supplies the piezoelectric plate 14 thus provided to an ultrasound probe manufacturer. The supplied piezoelectric plate 14 undergoes the poling process so as to check whether or not the piezoelectric plate 14 has sufficient piezoelectricity to operate the ultrasound probe. However, the poling process may be omitted when piezoelectric property is reliable.

Herein, an example in which the piezoelectric plate is supplied from the piezoelectric plate supplier is provided, but the ultrasound probe manufacturer may directly manufacture piezoelectric plates.

An ultrasound probe manufacturer may adjust the size of the piezoelectric plate 14 suitable for use in ultrasound probes by size-cutting when the size of the piezoelectric plate 14 supplied from the piezoelectric plate supplier is unsuitable for use in the ultrasound probes.

Size-cutting, which is one of the processes, refers to a process of cutting the piezoelectric plate 14 to a size suitable for mounting the piezoelectric plate 14 in the ultrasound probe and of polishing a side surface of the piezoelectric plate 14 or the like. The machining may include not only the size-cutting but also dicing.

A method for manufacturing an ultrasound probe according to at least one embodiment of the present invention may further include a depoling process. Upon being supplied with a non-polar piezoelectric plate 14, the ultrasound probe manufacturer may perform size-cutting of the depoled piezoelectric plate 14 without performing an additional poling process. However, upon being supplied with a piezoelectric plate 14 which is polarized by a poling process, the ultrasound probe manufacturer may perform size-cutting after an additional depoling process.

The depoling process may be performed on the piezoelectric plate 14 having been polarized by the poling process. The depoling process is performed to remove polarity of the piezoelectric plate 14. The depoling process is, for example, carried out by heating the piezoelectric plate 14. According to types of the piezoelectric material, an alignment of dipoles in the piezoelectric material is disrupted when heated up to the Curie temperature, that is, a phase transition temperature of the corresponding piezoelectric material. For reference, the Curie temperature refers to a temperature at which a ferromagnetic material is no longer magnetized by an exterior magnetizing force or a temperature at which the ferromagnetic material loses residual magnetism. In some embodiments, the depoling process may be carried out by heating the piezoelectric plate 14 to the Curie temperature. Piezoelectric single crystals may have a phase transition temperature at which piezoelectric single crystals change their structure and lose piezoelectricity, and depoling may occur in spite of heating to a temperature equal to or higher than the phase transition temperature.

In other words, the method for manufacturing ultrasound probes according to at least one embodiment of the present disclosure may include preparing a depoled piezoelectric plate 14 (S210). In addition, the method may include manufacturing ultrasound probes using the prepared depoled piezoelectric plate 14 (S220). In addition, the method may include individual poling of the manufactured ultrasound probes before testing (S230).

A polarized piezoelectric material generally has poor mechanical workability. For example, subject to size-cutting, which is a machining process, a surface of a polarized piezoelectric material to be size-cut is often neither smooth nor even. However, a size-cut surface of a piezoelectric material, polarity of which is lost by depoling is both smooth and even.

An additional size-cutting process is unnecessary when the piezoelectric plate 14 supplied from the piezoelectric plate supplier is of an accurate size for directly introducing the piezoelectric plate 14 into the lamination process. In this case, the supplied piezoelectric plate 14 may be directly introduced into the lamination process without any size-cutting process. However, in this case, too, the depoling process is preferably performed before dicing the second laminate.

Regarding dicing which is another machining process, a product obtained by dicing a polarized piezoelectric plate 14 tends not to be even or a portion of the diced product is easily defected, for example, cracked. However, dicing a second laminate using the piezoelectric plate 14, polarity of which is removed by a depoling process, provides a desirably even product.

Although size-cutting and dicing have been described as examples of the machining process, at least one embodiment of the present disclosure is not limited thereto and an ultrasound probe manufacturing process including other machining processes may further include depoling before machining.

After completion of an ultrasound probe manufacture using the depoled piezoelectric plate 14, the manufactured ultrasound probe undergoes poling to have polarity to the piezoelectric plate 14 in the ultrasound probe before testing. The ultrasound probe can start to operate by imparting the piezoelectricity to the piezoelectric plate 14.

Figure 7A:
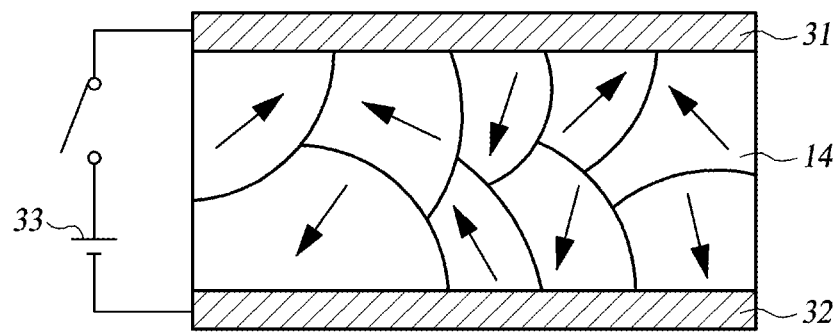
FIGS. 7A and 7B are diagrams illustrating a poling of a piezoelectric plate.
Figure 7B:
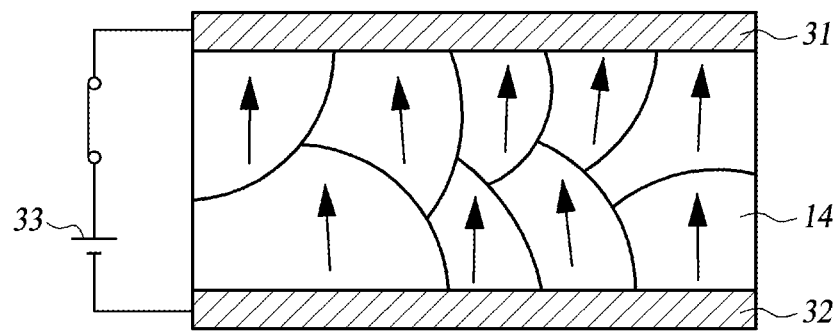

FIG. 7 is a conceptual diagram illustrating a poling of a piezoelectric plate. Specifically, FIG. 7A shows a state of dipoles before poling and FIG. 7B shows the diploes after closing a power switch, followed by the poling. FIGS. 7A and 7B are conceptual diagrams illustrating a poling method. In some embodiments, poling may be performed any time after dicing. After the depoled piezoelectric material went through machining, the piezoelectric material undergoes poling so that the piezoelectric material can reinstate the piezoelectricity. In at least one embodiment, the poling is carried out by forming electrodes 31 and 32 on upper and lower surfaces of the piezoelectric plate 14, respectively, and applying a poling voltage 33 to both ends of the formed electrodes. When the poling voltage 33 is applied to the piezoelectric plate 14, an electric field is generated and directions of dipoles in grains are thus gradually aligned by the electric field. In other embodiments, the manufactured ultrasound probe may be poled. In this case, the poling process may be individually performed on the manufactured ultrasound probes. Here, the poling may include connecting a cable for supplying a voltage to the ultrasound probe provided with the formed lens to a flexible printed circuit board, applying a DC voltage 33 thereto and performing poling.

In further embodiments of the present disclosure, a depoled piezoelectric material may be used as an active material added during the ultrasound probe manufacturing process. For example, the ultrasound probe can be manufactured by performing size-cutting, lamination, lens formation and poling processes on the depoled piezoelectric material. In addition, this case may perform poling of the completed ultrasound probe before testing.

Advantageously, product defect ratio is decreased and manufacturing cost is reduced by using the depoled piezoelectric material as a material for the ultrasound probe.

Figure 8:
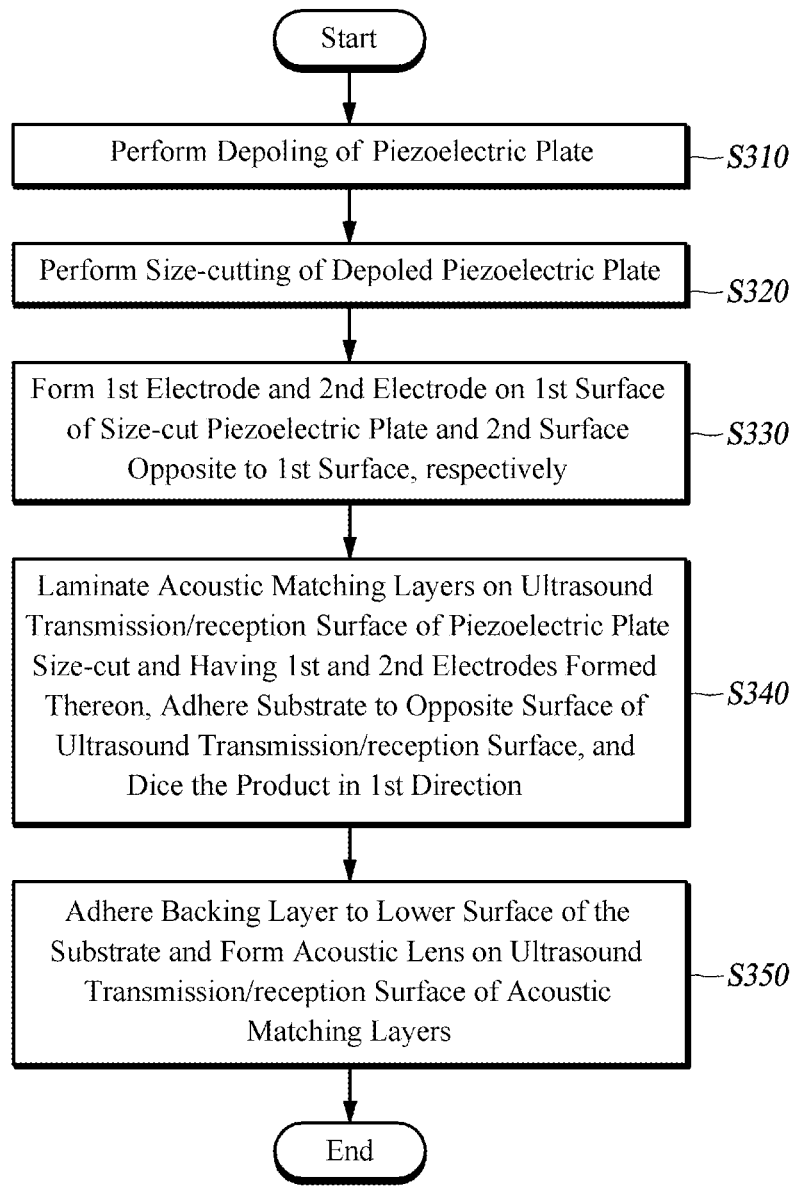
FIG. 8 is a flowchart illustrating a method for manufacturing an ultrasound probe according to at least one embodiment of the present disclosure.

FIG. 8 is a flowchart illustrating a method for manufacturing an ultrasound probe according to at least one embodiment of the present disclosure. Referring to FIG. 8, the method for manufacturing an ultrasound probe according to at least one embodiment may include depoling a piezoelectric plate 14 (S310). In addition, the method may include performing size-cutting of the depoled piezoelectric plate (S320). In addition, the method may include forming a first electrode and a second electrode on a first surface of the size-cut piezoelectric plate 14 and a second surface opposite to the first surface, respectively (S330). In addition, the method may include laminating the acoustic matching layers 16 and 17 on the ultrasound transmission/reception surface of the resulting piezoelectric plate, adhering the substrate 12 to the opposite surface of the ultrasound transmission/reception surface and performing dicing in the first direction (X direction, see FIGS. 4A, 4B, 5A and 5B) (S340). In addition, the method may include adhering the backing layer 11 to the lower surface of the substrate 12 and forming the acoustic lens 18 on the ultrasound transmission/reception surface of the acoustic matching layers 16 and 17 (S350).

The first surface may correspond to the ultrasound transmission/reception surface of the size-cut piezoelectric plate 14. A voltage may be applied to the piezoelectric plate 14 through the first electrode and the second electrode. In some embodiments, the first electrode may be the ground layer 15 while the second electrode may be a flexible printed circuit board 13. In other embodiments, the first electrode may be the flexible printed circuit board 13 while the second electrode may be the ground layer 15. The substrate 12 may serve to support the piezoelectric plate 14 which is provided with the first electrode and the second electrode and includes the acoustic matching layers 16 and 17 laminated thereon.

Although exemplary embodiments of the present disclosure have been described for illustrative purposes, those skilled in the art will appreciate that various modifications, additions and substitutions are possible, without departing from the idea and technical scope of the present disclosure as described in the claims.

REFERENCE NUMERALS

| | |
|---|---|
| 11: Backing layer | 12: Substrate |
| 13: Printed Circuit Board | 14: Piezoelectric Plate |
| 15: Ground Layer | 16: First Acoustic Matching Layer |
| 17: Second Acoustic Matching Layer | 18: Acoustic Lens |
| 20: Second Laminate | 21: Ultrasound Transducer |
| 31, 32: Electrodes formed on the top and bottom of Piezoelectric Plate | |
| 33: Poling Voltage | |

CROSS-REFERENCE TO RELATED APPLICATION

If applicable, this application claims priority under 35 U.S.C §119(a) of Patent Application No. 10-2012-0091962, filed on Aug. 22, 2012 in Korea, the entire content of which is incorporated herein by reference. In addition, this non-provisional application claims priority in countries, other than the U.S., with the same reason based on the Korean Patent Application, the entire content of which is hereby incorporated by reference.

The invention claimed is:

1. A method for manufacturing an ultrasound probe comprising:
   identifying whether a piezoelectric material has piezoelectricity;
   depoling the piezoelectric material;
   laminating a ground layer on a first surface of the piezoelectric material and laminating a printed circuit board on a second surface of the piezoelectric material, opposite to the first surface; and
   dicing the piezoelectric material laminated with the ground layer and the printed circuit board;
   wherein the dicing is performed after removing the piezoelectricity from the piezoelectric material by depoling the piezoelectric material.

2. The method of claim 1, further comprising:
   poling the depoled piezoelectric material after the dicing.

3. The method of claim 2, wherein the poling is performed after completion of fabrication of the ultrasound probe and before testing of the ultrasound probe.

4. The method of claim 3, wherein the ultrasound probe is one of a plurality of ultrasound probes manufactured, and the poling is independently performed on each one of the plurality of ultrasound probes.

5. The method of claim 1, wherein the depoling comprises heating the piezoelectric material to a temperature equal to or higher than a Curie temperature or a phase transition temperature.

6. The method of claim 1, wherein the piezoelectric material comprises a piezoelectric single crystal.

7. A method for manufacturing an ultrasound probe using a piezoelectric material, the method comprising:
   identifying whether the piezoelectric material has piezoelectricity;
   depoling the piezoelectric material;
   dicing the depoled piezoelectric material to thereby form a plurality of ultrasound transducers which are electrically independent from each other;
   poling the piezoelectric material; and
   forming the ultrasound probe including the piezoelectric material.

8. A method for manufacturing ultrasound probes comprising:
   depoling a piezoelectric plate;
   performing size-cutting of the depoled piezoelectric plate; and
   forming a first electrode and a second electrode on a first surface of the size-cut piezoelectric plate and on a second surface opposite to the first surface, respectively.

9. The method of claim 8, further comprising, after the formation of the first electrode and the second electrode:
   laminating acoustic matching layers on an ultrasound transmission/reception surface of the size-cut piezoelectric plate, adhering a substrate to an opposite surface of the ultrasound transmission/reception surface and then performing dicing in a first direction; and
   adhering a backing layer to the substrate and forming an acoustic lens on the ultrasound transmission/reception surface of the acoustic matching layers.

10. The method of claim 8, wherein a material for the piezoelectric plate is a single crystal.

* * * * *